United States Patent
Correale, Jr.

(10) Patent No.: US 7,091,574 B2
(45) Date of Patent: Aug. 15, 2006

(54) VOLTAGE ISLAND CIRCUIT PLACEMENT

(75) Inventor: Anthony Correale, Jr., Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 114 days.

(21) Appl. No.: 10/387,728

(22) Filed: Mar. 13, 2003

(65) Prior Publication Data

US 2004/0178493 A1    Sep. 16, 2004

(51) Int. Cl.
   *H01L 29/00*    (2006.01)
(52) U.S. Cl. .................................................. 257/510
(58) Field of Classification Search ................ 716/8; 257/510
   See application file for complete search history.

(56) References Cited

U.S. PATENT DOCUMENTS

| | | | |
|---|---|---|---|
| 4,467,518 A | 8/1984 | Bansal et al. | |
| 5,510,999 A | 4/1996 | Lee et al. | |
| 5,835,378 A | 11/1998 | Scepanovic et al. | |
| 6,259,135 B1 | 7/2001 | Hsu et al. | |
| 6,314,547 B1 | 11/2001 | Donath et al. | |
| 6,598,206 B1 * | 7/2003 | Darden et al. | 716/2 |
| 6,779,163 B1 * | 8/2004 | Bednar et al. | 716/7 |
| 6,831,483 B1 * | 12/2004 | Shimazaki et al. | 326/121 |
| 2001/0045571 A1 | 11/2001 | Gandhi et al. | |
| 2002/0040985 A1 | 4/2002 | Aldrich | |
| 2002/0076851 A1 | 6/2002 | Eden et al. | |
| 2002/0084804 A1 | 7/2002 | Horiguchi et al. | |

* cited by examiner

*Primary Examiner*—Howard Weiss
(74) *Attorney, Agent, or Firm*—Sawyer Law Group LLP

(57) ABSTRACT

A voltage island is disclosed. The voltage island comprises a physical domain and a lower voltage supply rail within the physical domain. The voltage island also includes an upper voltage supply rail within the physical domain. The physical domain is coupled to the appropriate voltage supply rail to ensure reverse biased junctions. Accordingly, a system in accordance with the present invention allows circuit placements associated with multiple voltage islands within a common circuit row or even adjacent circuit rows to be utilized in which the area effectiveness is greatly improved. The use of common Nwell biasing connected to the higher power supply ensures no forward biased junctions and allows butted circuit placement in cases where the other circuit physical constraints permit. This configuration will minimize the density loss associated multiple voltage island implementations.

16 Claims, 6 Drawing Sheets

VOLTAGE ISLAND CIRCUIT PLACEMENT

FIELD OF THE INVENTION

The present invention relates generally to VLSI circuits and more particularly to a system and method that maximizes the area efficiency of a VLSI circuit without affecting its performance.

BACKGROUND OF THE INVENTION

Voltage islands, that is areas on a VLSI chip having different voltages applied for the sole purpose of power reduction, are becoming more prevalent. In some cases these islands are large, distinct physical entities that have only a limited number of physical interfaces, but for the cases where the islands are more like islets, there are a number of physical issues that must be addressed.

Circuits, whether associated with an ASIC, foundry, or custom logic, attempt to maximize area efficiency. One such approach is the sharing of physical domains such as Nwells, Pwells or substrates. For the case of an Nwell process wherein the pfets are contained in an Nwell, the Nwell generally is biased to Vdd and is shared across two circuit rows, and in general, is contiguous within a row. To support a lower, alternate vdd, Vddl, as well as the standard or higher vdd, one is faced with the placement dilemma of Nwell proximity. If each Nwell is biased to its respective power rail, then row pairs must be first identified as requiring either a Vddl or Vdd Nwell bias. This limits placement as will be illustrated later. If, however, a common Nwell biasing scheme were to be employed, as is the premise of this disclosure, then placement could be handled independent of well placements.

To further illustrate these issues, refer now to the following description in conjunction with the accompanying figures. FIG. 1 illustrates a conventional standard cell configuration 10. This configuration 10 is generally mirrored about the x-axis to allow sharing of Nwells 12 and substrates. The Nwell 12 is either biased to Vddh 14 within a given circuit, or a separate Nwell tap cell is inserted between circuits.

FIG. 2 represents a pair of circuits comprising mirror flipped circuits 100 which create two circuit placement rows. In this figure the common Nwell 102 is associated with the mirror-flipped circuit pairs, each of which is biased to Vddh 106. FIG. 3 illustrates a four-row circuit placement 200 with shared Nwells 202a and 202b and common power supply rails Vddh 206. Circuit rows 1 and 2, and 3 and 4 each share their respective Nwells 202a and 202b. For any of these configurations, physical layout ground rules for Nwells 202a and 202b are generally rather large. The typical NW to NW space is generally more than twice the metal-2 pitch. That means that if two circuits were to be placed in a common row with differently biased Nwells, that a minimum of 3-wiring tracks would have to be left vacant. This represents a rather large unused area on a VLSI circuit.

FIG. 4 illustrates voltage island cell arrangement 300 for non-common Nwell biasing between islands. Rows 1 and 2 are associated with two distinct power domains in the leftmost island rows 1 and 2, share a common Vddh 306 (i.e., 5V) and in the rightmost island rows 1 and 2 have a common Vddl 308 (i.e., 3V). In this arrangement, the area within each island can be used relatively effectively. However, if the biasing schemes for Nwells 302a and 302b are different, Nwell sharing between these distinct Nwells is not possible.

FIG. 5 illustrates the effect of not supporting common biased Nwells for placements. In this figure, as is seen, large placement voids result. The other alternative is that circuits having common Nwells might be placed in those regions even if those regions were not the best locations from a wiring perspective.

Accordingly, what is needed is a common Nwell implementation which will result in the most area efficiency and will reduce leakage current. The present invention addresses such a need.

SUMMARY OF THE INVENTION

A voltage island is disclosed. The voltage island comprises a physical domain and a lower voltage supply rail within the physical domain. The voltage island also includes an upper voltage supply rail within the physical domain. The physical domain is coupled to the appropriate voltage supply rail to ensure reverse biased junctions.

Accordingly, a system in accordance with the present invention allows circuit placements associated with multiple voltage islands within a common circuit row or even adjacent circuit rows to be utilized in which the area effectiveness is greatly improved. The use of common physical domain biasing connected to the appropriate power supply ensures no forward biased junctions and allows butted circuit placement in cases where the other circuit physical constraints permit. This configuration will minimize the density loss associated multiple voltage island implementations.

DETAILED DESCRIPTION

The present invention relates to VLSI circuits and more particularly to a system and method that maximizes the area efficiency of a VLSI circuit without affecting its performance. The following description is presented to enable one of ordinary skill in the art to make and use the invention and is provided in the context of a patent application and its requirements. Thus, the present invention is not intended to be limited to the embodiment shown, but is to be accorded the widest scope consistent with the principles and features described herein.

A system and method in accordance with the present invention improves area effectiveness between multiple voltage islands by connecting a physical domain in such a manner as to ensure reverse biased junctions. In so doing, leakage is thereby minimized. In addition, islands can be abutted together, thereby maximizing area effectiveness.

To describe the features of the present invention in more detail, refer now to the following discussion in conjunction with the accompanying figures.

Figure 1:
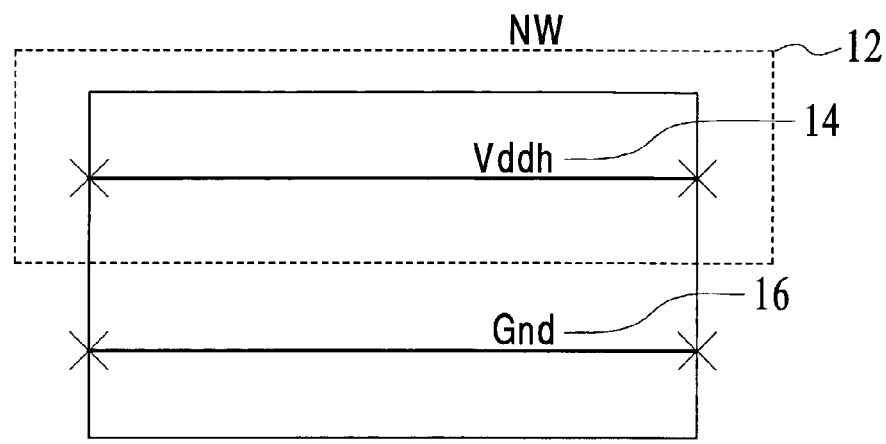
FIG. 1 illustrates a conventional standard cell configuration.
Figure 2:
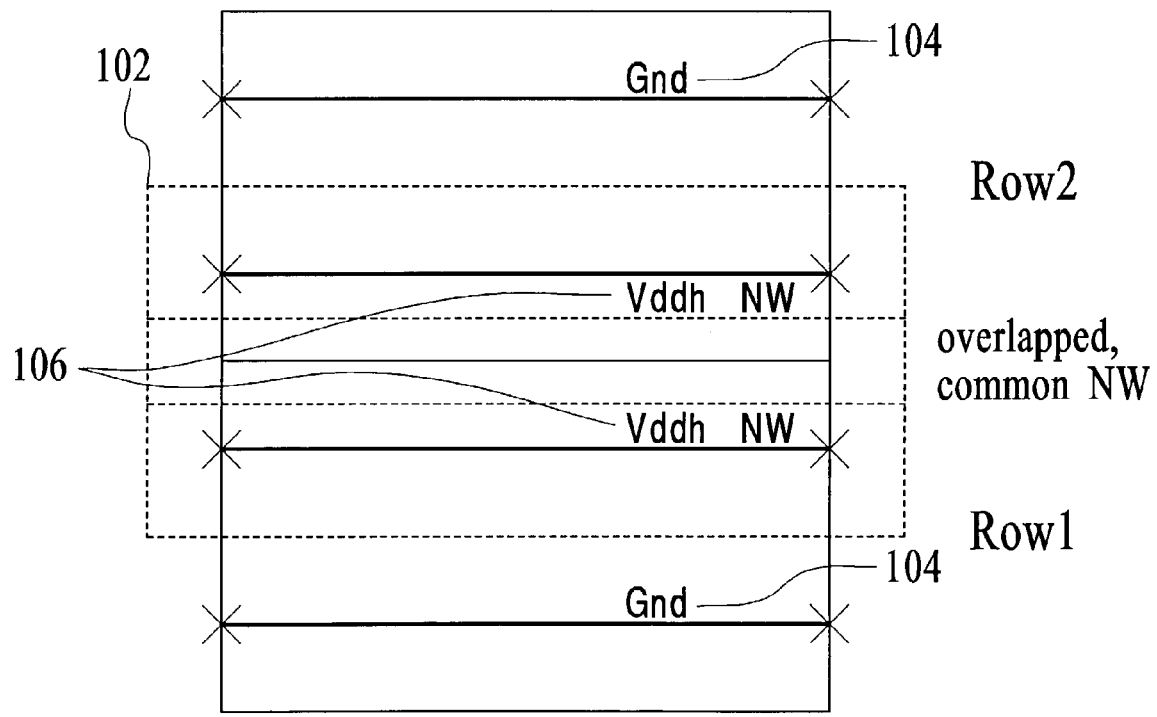
FIG. 2 represents a pair of circuits comprising mirror-flipped circuits which create two circuit placement rows.
Figure 3:
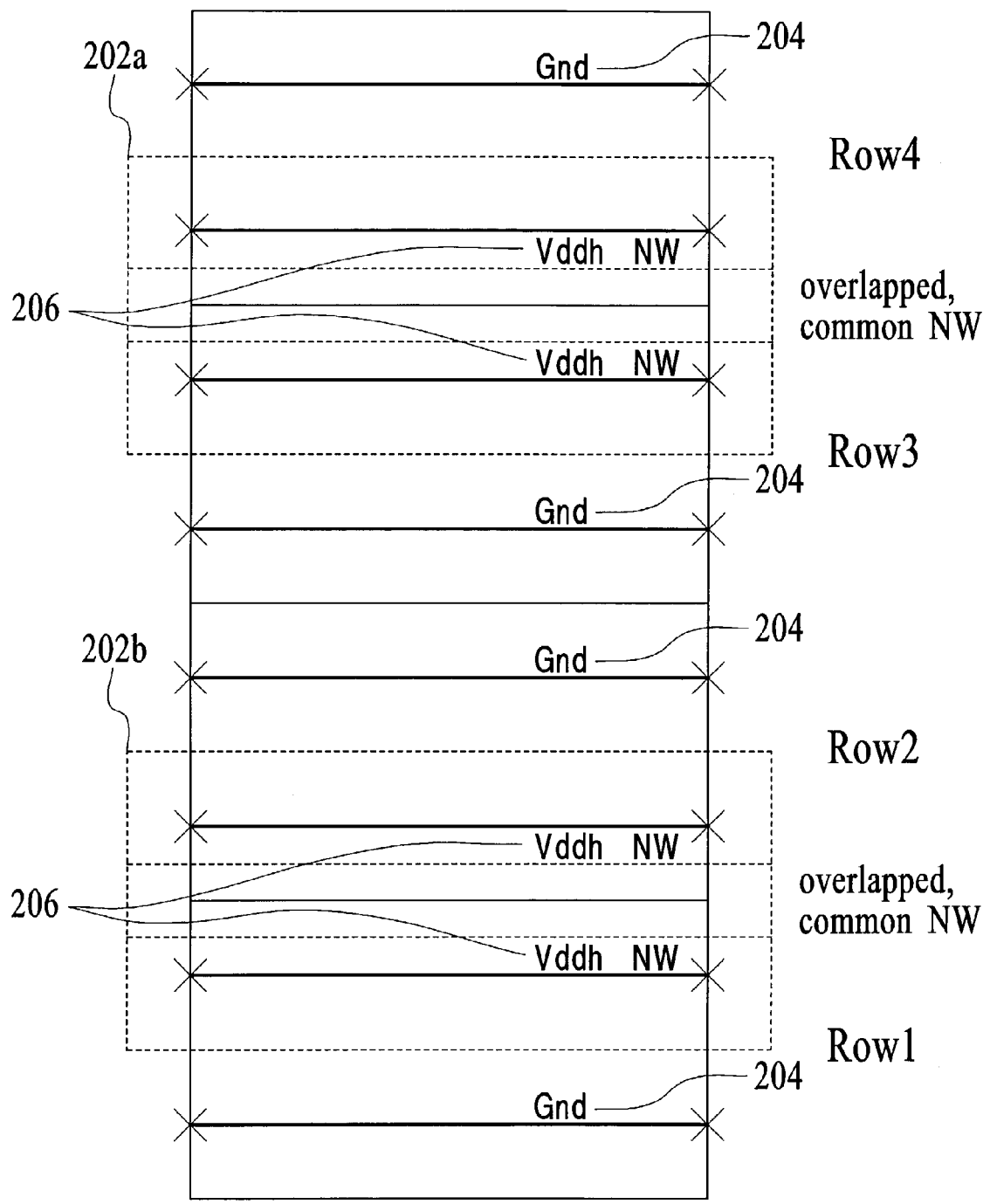
FIG. 3 illustrates four-row circuit placement with shared Nwells and common power supply rails.
Figure 4:
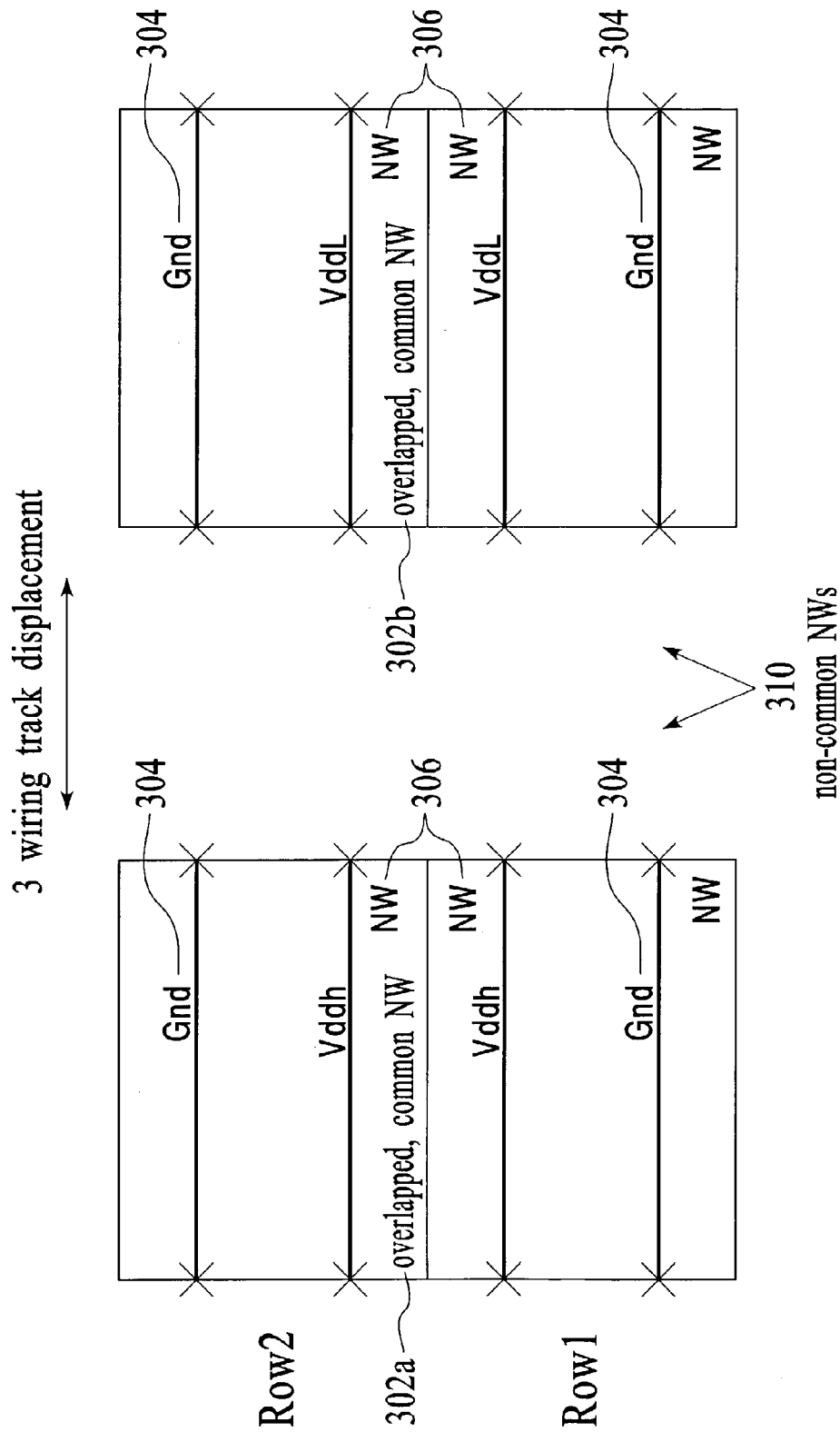
FIG. 4 illustrates voltage island cell arrangement for non-common Nwell biasing between islands.
Figure 5:
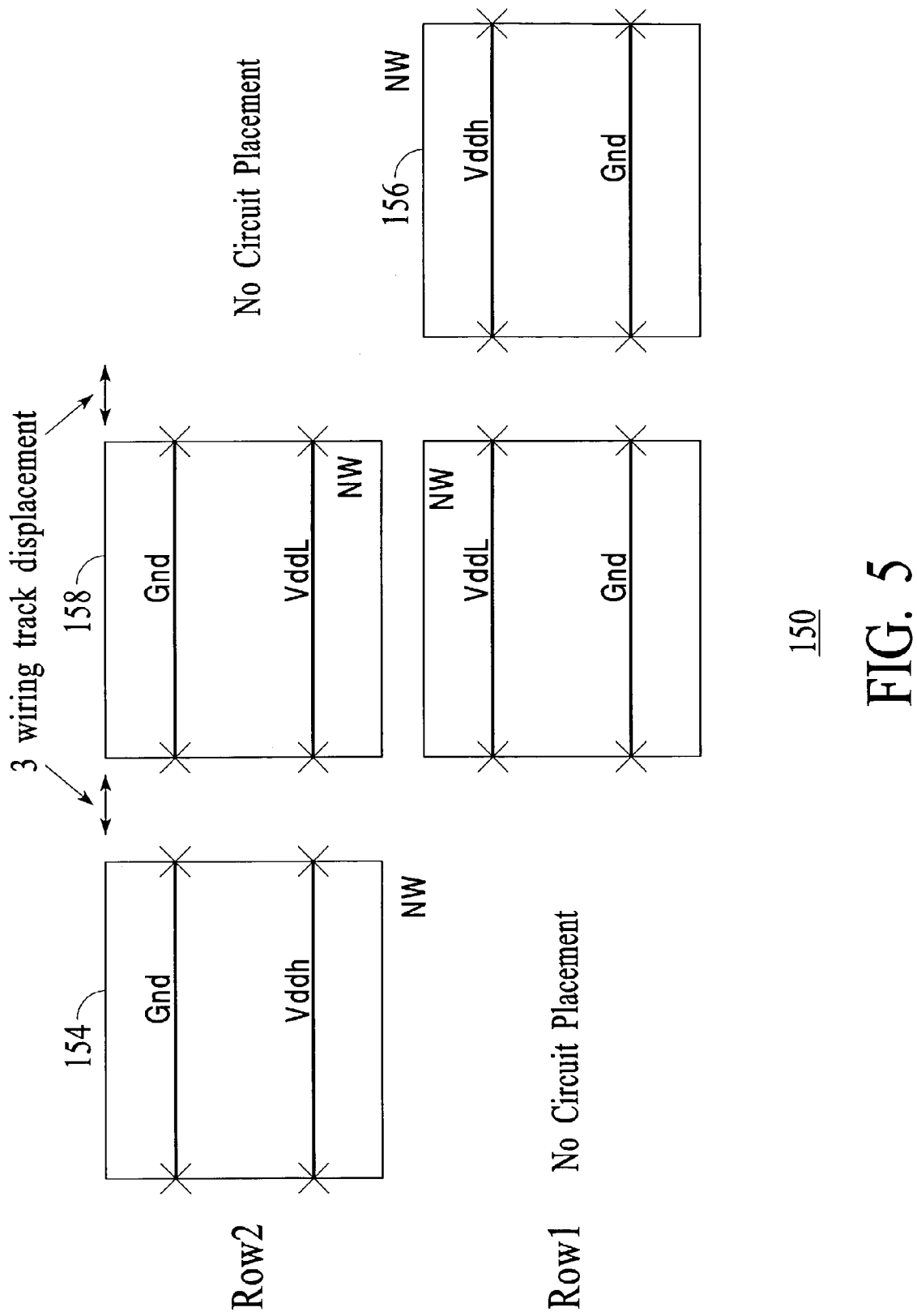
FIG. 5 illustrates the effect of not supporting common biased Nwells for placements.
Figure 6:
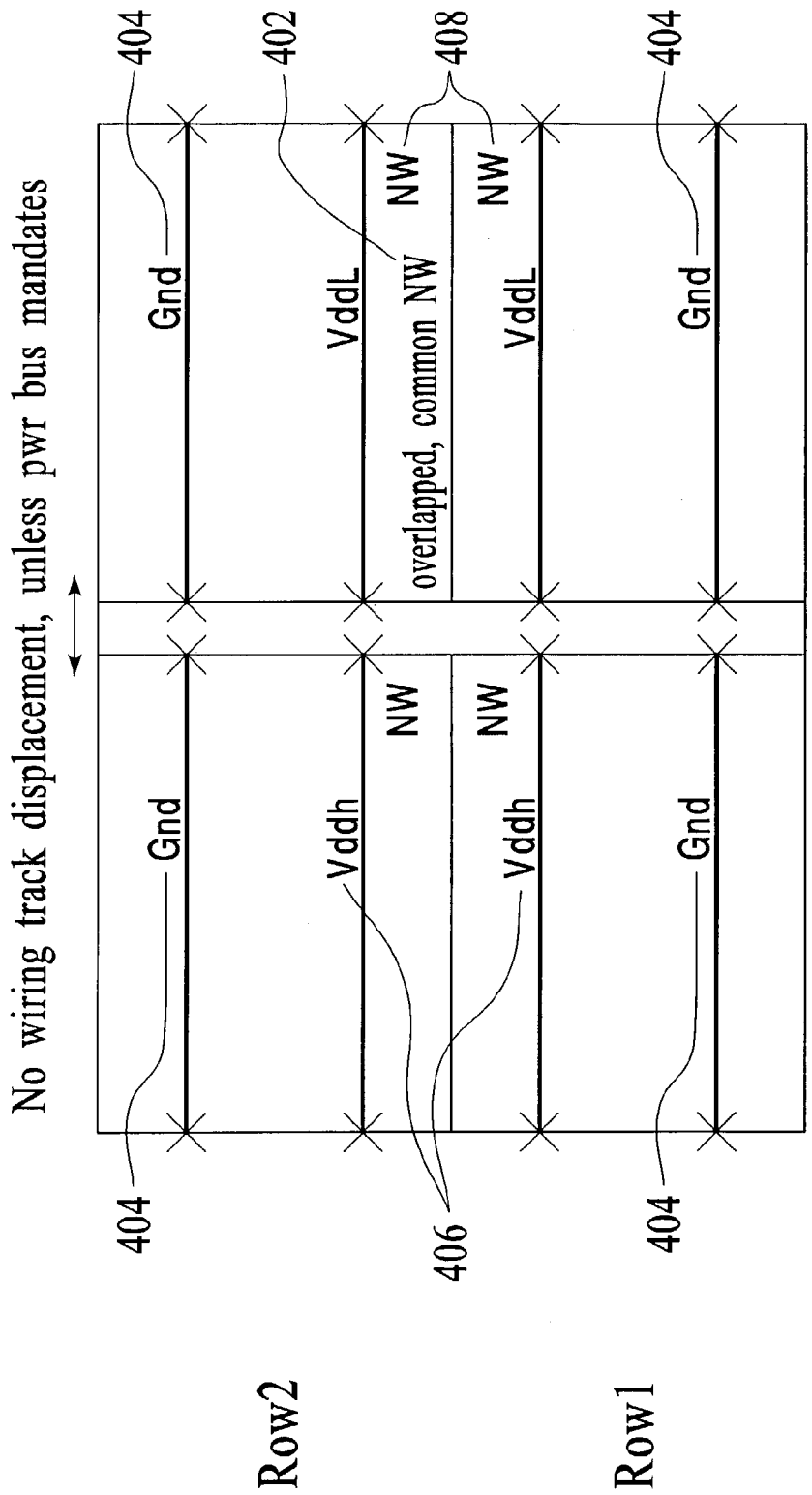
FIG. 6 illustrates shared Nwells with common bias for a voltage island realization in accordance with the present invention

FIG. 6 illustrates shared Nwells with common bias for a voltage island realization in accordance with the present invention. Note that in both FIG. 4 and FIG. 6, there are two different voltage power supply rails, Vddh and Vddl. In FIG. 4 the circuits had to be physically displaced as separate voltage islands to satisfy the Nwell spacing requirements, but in FIG. 6, the circuits are allowed to butt up against one another and form one common Nwell since they have a commonly biased Nwell 402 at Vddh 406. In so doing, none of the junctions within the island are forward biased. The circuits can be in close proximity since the Nwell 402 is coupled to the high voltage power supply rail Vddh 406.

It should be understood that this system could also be utilized in a device which includes Pwells that are commonly biased. In that embodiment, the commonly biased Pwell would be coupled to the lowest voltage supply rail (usually ground).

Figure 7:
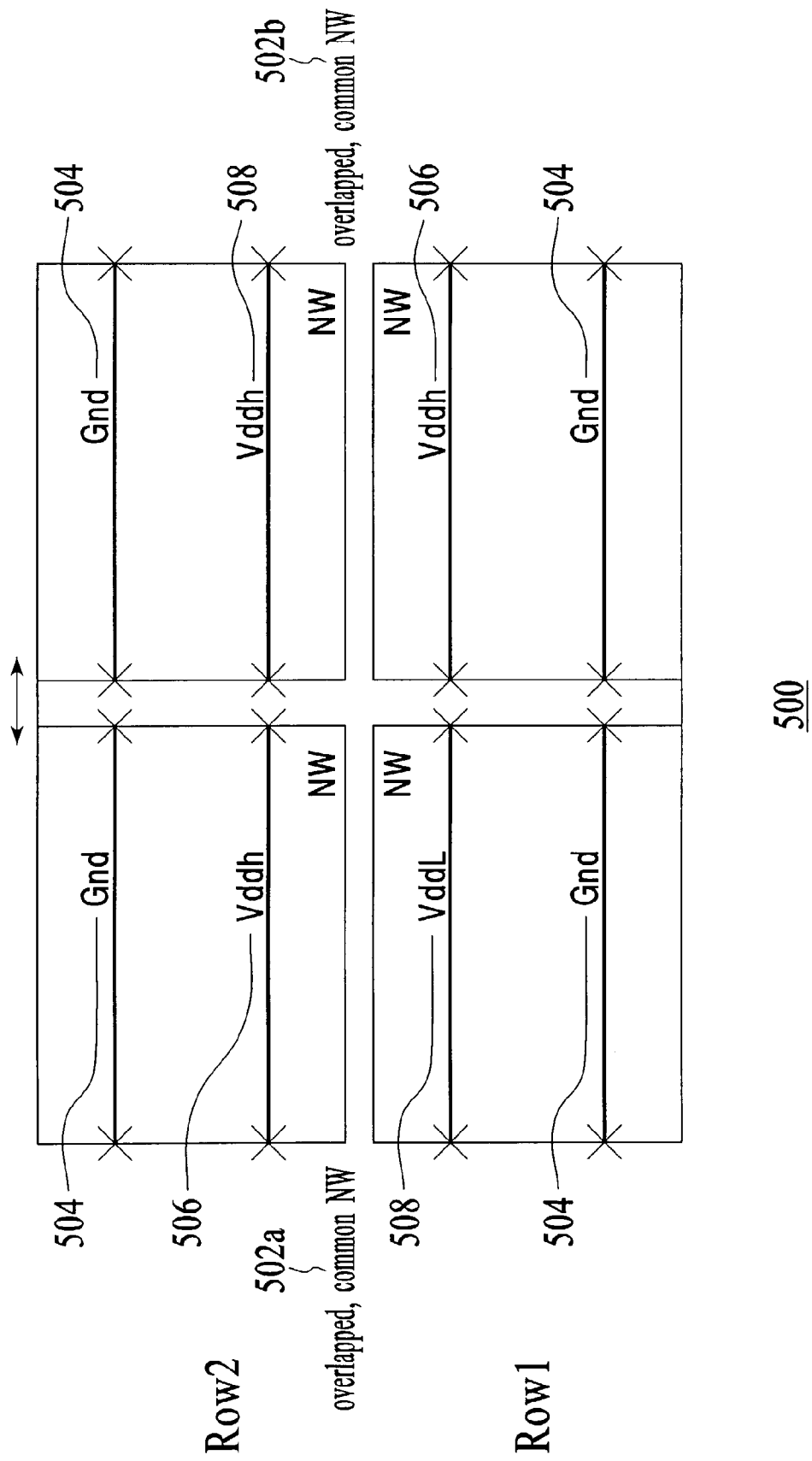
FIG. 7 illustrates another embodiment of a voltage island in accordance with the present invention.

FIG. 7 illustrates another embodiment of a voltage island in accordance with the present invention. Shared Nwells 502a and 502b have a common connection to Vddh 506 for a voltage island realization. As is seen, Vddh 506 and Vddl 508 are in alternate positions in each of the rows.

Accordingly, a system in accordance with the present invention allows circuit placements associated with multiple voltage islands within a common circuit row or even adjacent circuit rows to be utilized in which the area effectiveness is greatly improved. The use of common physical domain biasing coupled to the power supply rail ensures no forward biased junctions are provided. The system also allows butted circuit placement in cases where the other circuit physical constraints permit. This configuration will minimize the density loss associated multiple voltage island implementations.

Although the present invention has been described in accordance with the embodiments shown, one of ordinary skill in the art will readily recognize that there could be variations to the embodiments and those variations would be within the spirit and scope of the present invention. For example, although the present invention has been described utilizing an Nwell as the physical domain of the voltage island, one of ordinary skill in the art recognizes that a physical domain in a circuit could be a Pwell substrate or other type of physical domain and the use would be within the spirit and scope of the present invention. This same approach can also be utilized in technology such as triple well. Similarly, multiple voltage islands could be utilized with any number of voltage supplies and their use would be within the spirit and scope of the present invention. Accordingly, many modifications may be made by one of ordinary skill in the art without departing from the spirit and scope of the appended claims.

What is claimed is:

1. A voltage island comprising:
a physical domain;
a lower voltage supply rail within the physical domain; and
an upper voltage supply rail within the physical domain, wherein the physical domain is coupled to the appropriate voltage supply rail to ensure no forward biased junctions.

2. The voltage island of claim 1 wherein the physical domain comprises an Nwell, wherein the Nwell is coupled to the upper voltage supply rail.

3. The voltage island of claim 1 wherein the physical domain comprises an overlapped Nwell, wherein the overlapped Nwell is coupled to the upper voltage supply rail.

4. The voltage island of claim 1 wherein the physical domain comprises a Pwell, wherein the Pwell is coupled to a lowest voltage supply rail.

5. The voltage island of claim 1 wherein the physical domain comprises an overlapped Pwell, wherein the overlapped Pwell is coupled to a lowest voltage supply rail.

6. The voltage island of claim 1 which includes a ground within the physical domain.

7. A voltage island comprising:
an overlapped physical domain,
a first row within the overlapped physical domain, the first row including a first upper power supply voltage rail and a first lower power supply rail; and
a second row within the overlapped physical domain, the second row including a second upper power supply rail and a second lower power supply rail, wherein the overlapped physical domain is coupled to the appropriate voltage supply rails to ensure no forward biased junctions.

8. The voltage island of claim 7 wherein the first and second upper power supply rails are in alternative positions with respect to each other and the first and second lower power supply rails are in alternative positions with respect to each other.

9. A circuit comprising:
a substrate, and
at least one voltage island within the substrate, the at least one voltage island comprising a physical domain, a lower voltage supply rail within the physical domain, and an upper voltage supply rail within the physical domain, wherein the physical domain is coupled to the appropriate voltage supply rail to ensure no forward biased junctions.

10. The circuit of claim 9 wherein the physical domain comprises an Nwell, wherein the Nwell is coupled to the upper voltage supply rail.

11. The circuit of claim 9 wherein the physical domain comprises an overlapped Nwell, wherein the overlapped Nwell is coupled to the upper voltage supply rail.

12. The circuit of claim 9 wherein the physical domain comprises a Pwell, wherein the Pwell is coupled to a lowest voltage supply rail.

13. The circuit of claim 12 wherein the physical domain comprises an overlapped Pwell that is coupled to a lowest voltage supply rail.

14. The circuit of claim 9 which includes a ground in to the physical domain.

15. A circuit comprising:
a substrate, and
at least one voltage island within the substrate, the at least one voltage island comprising an overlapped Nwell within an overlapped physical domain, a first row within the overlapped power supply rail, the first row including a first upper power supply voltage rail and a first lower power supply rail and a second row within the overlapped physical domain, the second row including a second upper power supply rail and a second lower power supply rail, wherein the overlapped physical domain is coupled to the appropriate voltage supply rails to ensure no forward biased junctions.

16. The circuit of claim 15 wherein the first and second upper power supply rails are in alternative positions with respect to each other and the first and second lower power supply rails are in alternative positions with respect to each other.

* * * * *